United States Patent
Hsieh et al.

(10) Patent No.: US 11,799,437 B2
(45) Date of Patent: Oct. 24, 2023

(54) RADIO FREQUENCY DEVICE AND MULTI-BAND MATCHING CIRCUIT

(71) Applicant: RichWave Technology Corp., Taipei (TW)

(72) Inventors: Pei-Chuan Hsieh, Taipei (TW); Chih-Sheng Chen, Taipei (TW); Hang Chang, Taipei (TW)

(73) Assignee: RichWave Technology Corp., Taipei (TW)

( * ) Notice: Subject to any disclaimer, the term of this patent is extended or adjusted under 35 U.S.C. 154(b) by 36 days.

(21) Appl. No.: 17/570,361

(22) Filed: Jan. 6, 2022

(65) Prior Publication Data
US 2023/0179242 A1    Jun. 8, 2023

(30) Foreign Application Priority Data
Dec. 2, 2021   (TW) ................... 110145011

(51) Int. Cl.
*H03H 7/01* (2006.01)
*H03H 7/38* (2006.01)
*H04B 1/10* (2006.01)

(52) U.S. Cl.
CPC ............ *H03H 7/0115* (2013.01); *H03H 7/38* (2013.01); *H04B 1/1036* (2013.01); *H04B 2001/1072* (2013.01)

(58) Field of Classification Search
CPC .............................. H03H 7/38; H03H 7/0115
USPC .......................................... 333/32, 124, 175
See application file for complete search history.

(56) References Cited

U.S. PATENT DOCUMENTS

| | | | |
|---|---|---|---|
| 7,548,734 | B2 | 6/2009 | Lin et al. |
| 2013/0063223 | A1 | 3/2013 | See et al. |
| 2013/0190036 | A1 | 7/2013 | Zhao et al. |
| 2015/0015346 | A1* | 1/2015 | Jou ............ H03B 5/1215 334/55 |

(Continued)

FOREIGN PATENT DOCUMENTS

| | | |
|---|---|---|
| CN | 102474227 | 5/2012 |
| TW | I252632 | 4/2006 |

(Continued)

OTHER PUBLICATIONS

"Office Action of Taiwan Counterpart Application", dated Jul. 12, 2022, p. 1-p. 9.

*Primary Examiner* — Rakesh B Patel
(74) *Attorney, Agent, or Firm* — JCIPRNET

(57) ABSTRACT

A radio frequency (RF) device and a multi-band matching circuit thereof are provided. The multi-band matching circuit includes an inductance circuit, a first capacitance circuit, an inductor, and a second capacitance circuit. A first terminal of the inductance circuit is coupled to a RF signal input terminal of the multi-band matching circuit. A first terminal of the first capacitance circuit is coupled to a second terminal of the inductance circuit. A first terminal of the inductor and a first terminal of the second capacitance circuit are coupled to a second terminal of the first capacitance circuit. A second terminal of the inductor is coupled to a first reference voltage. A second terminal of the second capacitance circuit is coupled to a second reference voltage. The second capacitance circuit is controlled by a single-bit control signal to change a capacitance value of the second capacitance circuit.

20 Claims, 12 Drawing Sheets

(56) References Cited

U.S. PATENT DOCUMENTS

2020/0403582 A1   12/2020   Takenaka et al.
2021/0099140 A1    4/2021   Hassan et al.

FOREIGN PATENT DOCUMENTS

| TW | I654831   | 3/2019 |
| TW | 201929449 | 7/2019 |
| TW | 202107859 | 2/2021 |

\* cited by examiner

RADIO FREQUENCY DEVICE AND MULTI-BAND MATCHING CIRCUIT

CROSS-REFERENCE TO RELATED APPLICATION

This application claims the priority benefit of Taiwan application serial no. 110145011, filed on Dec. 2, 2021. The entirety of the above-mentioned patent application is hereby incorporated by reference herein and made a part of this specification.

BACKGROUND

Technical Field

The disclosure relates to a radio frequency (RF) circuit, and particularly relates to a radio frequency device and a multi-band matching circuit thereof.

Description of Related Art

In a radio frequency (RF) device, a transmitter amplifier may gain the radio frequency transmission signal, and output the gained radio frequency transmission signal to an antenna. For a dual-band or multi-band application, the output matching of a transmitter amplifier is one of many technical topics in the art.

SUMMARY

The disclosure provides a radio frequency (RF) device and a multi-band matching circuit thereof, which may be adapted to a dual-band or multi-band application.

In an embodiment of the disclosure, the multi-band matching circuit includes a first inductance circuit, a first capacitance circuit, a first inductor, and a second capacitance circuit. A first terminal of the first inductance circuit is coupled to a radio frequency signal input terminal of the multi-band matching circuit. A first terminal of the first capacitance circuit is coupled to a second terminal of the first inductance circuit. A first terminal of the first inductor is coupled to a second terminal of the first capacitance circuit. A second terminal of the first inductor is coupled to a first reference voltage. A first terminal of the second capacitance circuit is coupled to the second terminal of the first capacitance circuit. A second terminal of the second capacitance circuit is coupled to a second reference voltage. The second capacitance circuit is controlled by a single-bit control signal to change a capacitance value of the second capacitance circuit.

In an embodiment of the disclosure, the radio frequency device includes an antenna, a switch circuit, a receiver amplifier, a transmitter amplifier, and a multi-band matching circuit. A common terminal of the switch circuit is coupled to the antenna. An input terminal of the receiver amplifier is coupled to a first selection terminal of the switch circuit. A first terminal and a second terminal of the multi-band matching circuit are respectively coupled to an output terminal of the transmitter amplifier and a second selection terminal of the switch circuit. The multi-band matching circuit includes a first inductance circuit, a first capacitance circuit, a first inductor, and a second capacitance circuit. A first terminal of the first inductance circuit is coupled to the output terminal of the transmitter amplifier. A first terminal of the first capacitance circuit is coupled to a second terminal of the first inductance circuit. A first terminal of the first inductor is coupled to a second terminal of the first capacitance circuit. A second terminal of the first inductor is coupled to a first reference voltage. A first terminal of the second capacitance circuit is coupled to the second terminal of the first capacitance circuit. A second terminal of the second capacitance circuit is coupled to a second reference voltage. The second capacitance circuit is controlled by a single-bit control signal to change a capacitance value of the second capacitance circuit.

Based on the above, the multi-band matching circuit described in various embodiments of the disclosure may adaptively adjust the capacitance value of the second capacitance circuit based on the control of the single-bit control signal, thereby adjusting a notch to filter out a harmonic. Therefore, the multi-band matching circuit may be adapted to the dual-band or multi-band application.

In order for the features and advantages of the disclosure to be more comprehensible, the following specific embodiments are described in detail in conjunction with the accompanying drawings.

DETAILED DESCRIPTION OF DISCLOSED EMBODIMENTS

Figure 1:
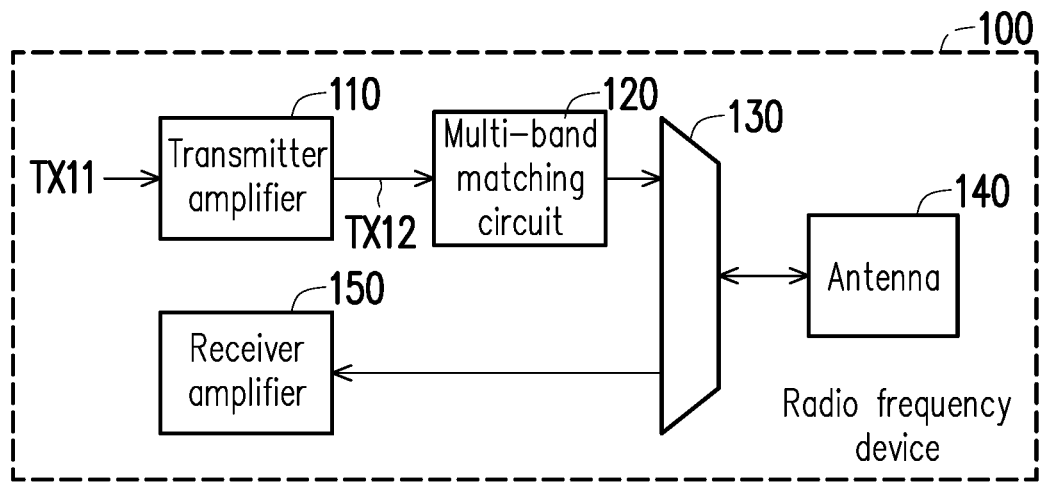
FIG. 1 is a circuit block diagram of a radio frequency (RF) device according to an embodiment of the disclosure.

The term "coupling (or connection)" used in the full text of the specification (including the claims) of the disclosure may refer to any direct or indirect connection means. For example, if a first device is described in the text as being coupled (or connected) to a second device, it should be interpreted as that the first device may be directly connected to the second device or the first device may be indirectly connected to the second device through another device or a certain connection means. Terms such as "first" and "second" mentioned in the full text of the specification (including the claims) of the disclosure are used to name elements or to distinguish different embodiments or ranges, and are not used to limit an upper limit or a lower limit of the number of the elements or limit the sequence of the elements. In addition, wherever possible, elements/components/steps with the same reference numerals in the drawings and embodiments represent the same or similar parts. Related descriptions of the elements/components/steps with the same reference numerals or the same terms in different embodiments may be cross-referenced.

FIG. 1 is a circuit block diagram of a radio frequency (RF) device 100 according to an embodiment of the disclosure. The radio frequency device 100 shown in FIG. 1 includes a transmitter amplifier 110, a multi-band matching circuit 120, a switch circuit 130, an antenna 140, and a receiver amplifier 150. A common terminal of the switch circuit 130 is coupled to the antenna 140. An input terminal of the receiver amplifier 150 is coupled to a first selection terminal of the switch circuit 130. A first terminal and a second terminal (a radio frequency signal input terminal and a radio frequency signal output terminal) of the multi-band matching circuit 120 are respectively coupled to an output terminal of the transmitter amplifier 110 and a second selection terminal of the switch circuit 130. According to actual design, the transmitter amplifier 110 may include a power amplifier or other amplifier circuits. The transmitter amplifier 110 may gain a radio frequency signal TX11, and output the gained radio frequency signal TX12 to the antenna 140 through the multi-band matching circuit 120 and the switch circuit 130. The receiver amplifier 150 may receive a wireless signal sensed by the antenna 140 through the switch circuit 130. According to actual design, the receiver amplifier 150 may include a low noise amplifier (LNA) or other amplifier circuits.

The multi-band matching circuit 120 may adjust a notch to filter out a harmonic, that is, adjust the output matching of the transmitter amplifier 110. Therefore, the radio frequency device 100 may be adapted to a dual-band or multi-band application. The implementation of the multi-band matching circuit 120 may be referred to the relevant descriptions of the different embodiments below.

Figure 2:
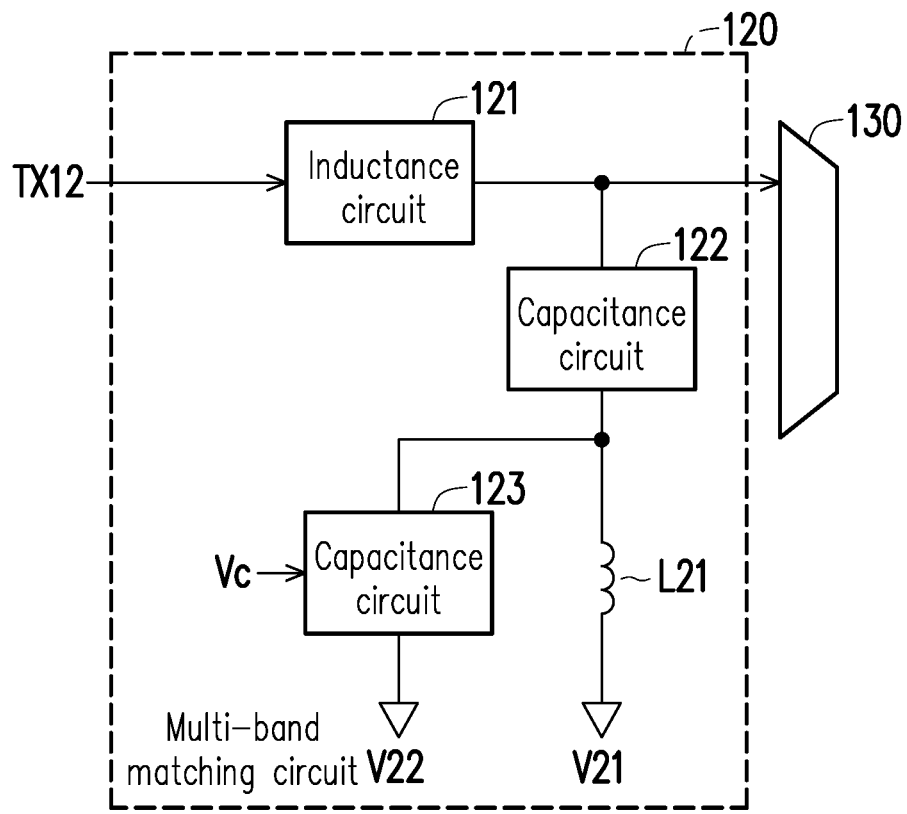
FIG. 2 is a circuit block diagram of a multi-band matching circuit according to an embodiment of the disclosure.

FIG. 2 is a circuit block diagram of a multi-band matching circuit 120 according to an embodiment of the disclosure. Reference may be made to the related descriptions of FIG. 1 for a radio frequency signal TX12, the multi-band matching circuit 120, and a switch circuit 130 shown in FIG. 2. The multi-band matching circuit 120 shown in FIG. 2 may serve as one of many embodiments of the multi-band matching circuit 120 shown in FIG. 1. The multi-band matching circuit 120 shown in FIG. 2 includes an inductance circuit 121 (the first inductance circuit), a capacitance circuit 122 (the first capacitance circuit), a capacitance circuit 123 (the second capacitance circuit), and an inductor L21 (the first inductor). An inductance value of the inductor L21 may be determined according to actual design.

A first terminal of the inductance circuit 121 is coupled to a radio frequency signal input terminal of the multi-band matching circuit 120 to receive the radio frequency signal TX12. A second terminal of the inductance circuit 121 is coupled to a radio frequency signal output terminal of the multi-band matching circuit 120, that is, coupled to a second selection terminal of the switch circuit 130. A first terminal of the capacitance circuit 122 is coupled to the second terminal of the inductance circuit 121. A first terminal of the inductor L21 is coupled to a second terminal of the capacitance circuit 122. A second terminal of the inductor L21 is coupled to a reference voltage V21. According to actual design, the reference voltage V21 may be a ground voltage or other fixed voltages. A first terminal of the capacitance circuit 123 is coupled to the second terminal of the capacitance circuit 122. A second terminal of the capacitance circuit 123 is coupled to a reference voltage V22. According to actual design, the reference voltage V22 may be a ground voltage or other fixed voltages.

In summary, the capacitance circuit 123 is controlled by a single-bit control signal Vc to change a capacitance value of the capacitance circuit 123. Based on the control of the single-bit control signal Vc, the multi-band matching circuit 120 may adaptively adjust the capacitance value of the capacitance circuit 123, thereby adjusting a notch frequency to filter out different harmonic components. Therefore, the multi-band matching circuit 120 may be adapted to the multi-band application.

Figure 3:
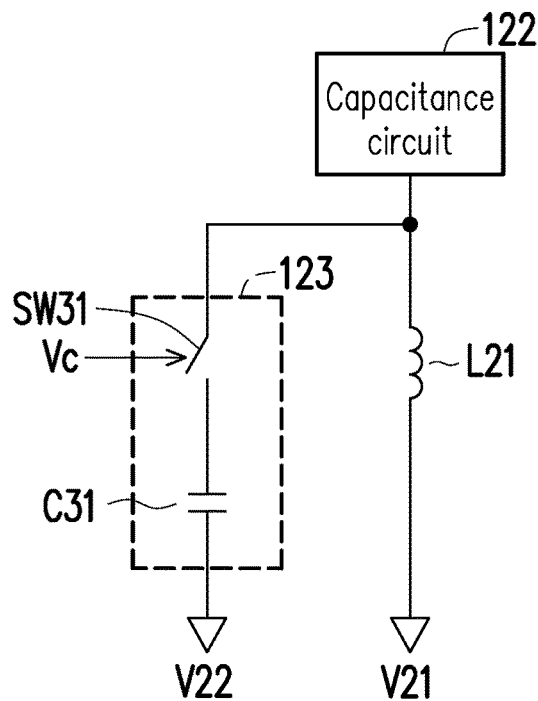
FIG. 3 is a circuit block diagram of a capacitance circuit according to an embodiment of the disclosure.

According to actual design, the capacitance circuit 123 may be any type of variable capacitor. For example, FIG. 3 is a circuit block diagram of a capacitance circuit 123 according to an embodiment of the disclosure. Reference may be made to the related descriptions of FIG. 2 for a capacitance circuit 122, the capacitance circuit 123, an inductor L21, a single-bit control signal Vc, a reference voltage V21, and a reference voltage V22 shown in FIG. 3. The capacitance circuit 123 shown in FIG. 3 may serve as one of many embodiments of the capacitance circuit 123 shown in FIG. 2.

The capacitance circuit 123 shown in FIG. 3 includes a switch SW31 and a capacitor C31. A capacitance value of the capacitor C31 may be determined according to actual design. The switch SW31 is controlled by the single-bit control signal Vc. A first terminal of the switch SW31 is coupled to a second terminal of the capacitance circuit 122. A first terminal of the capacitor C31 is coupled to a second terminal of switch SW31. A second terminal of the capacitor C31 is coupled to the reference voltage V22. The single-bit control signal Vc may turn on or turn off the switch SW31, thereby changing a capacitance value of the capacitance circuit 123.

Figure 4:
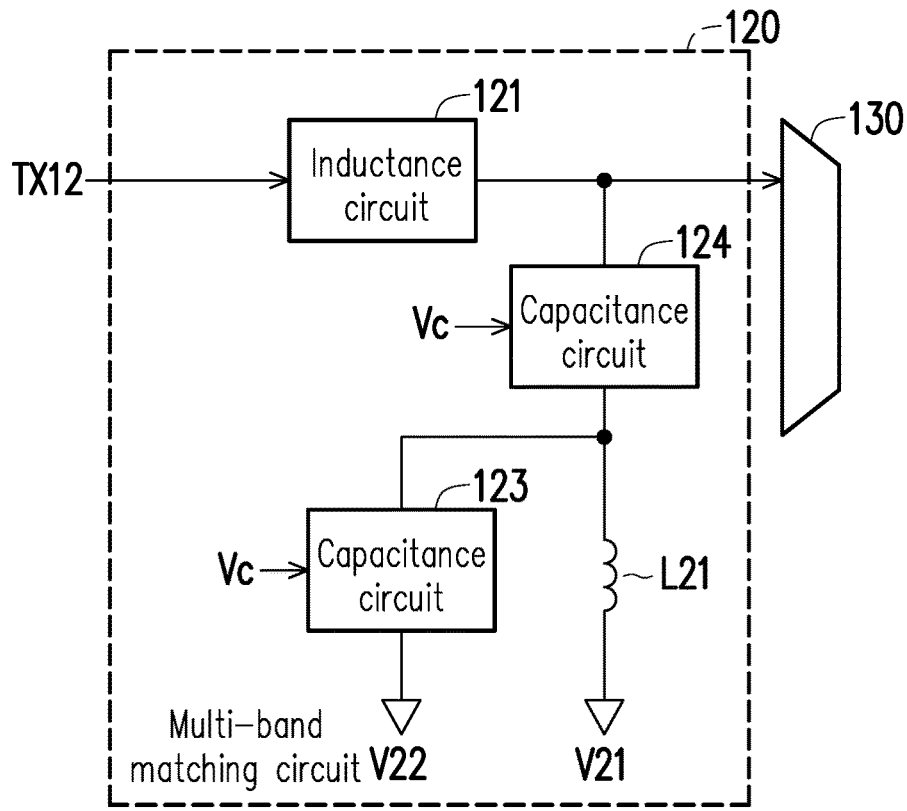
FIG. 4 is a circuit block diagram of a multi-band matching circuit according to another embodiment of the disclosure.

FIG. 4 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 4, so there will be no repetition. The multi-band matching circuit 120 shown in FIG. 4 may serve as one of many embodiments of the multi-band matching circuit 120 shown in FIG. 1. The multi-band matching circuit 120 shown in FIG. 4 includes an inductance circuit 121, a capacitance circuit 124, a capacitance circuit 123, and an inductor L21. Reference may be made to the related descriptions of the inductance circuit 121, the capacitance circuit 122, the capacitance circuit 123, and the inductor L21 shown in FIG. 2 for the inductance circuit 121, the capacitance circuit 124, the capacitance circuit 123, and the inductor L21 shown in FIG. 4.

Different from the capacitance circuit 122 shown in FIG. 2, the capacitance circuit 124 shown in FIG. 4 may be controlled by a single-bit control signal Vc to change a capacitance value of the capacitance circuit 124. Based on the control of the single-bit control signal Vc, the multi-band matching circuit 120 may adaptively adjust capacitance values of the capacitance circuits 123 and 124, thereby adjusting a notch frequency to filter out different harmonic components. In addition, by adjusting the capacitance value of the capacitance circuit 124, the multi-band matching circuit 120 may adaptively adjust different fundamental impedances. Therefore, the multi-band matching circuit 120 shown in FIG. 4 may be adapted to the multi-band application.

Figure 5:
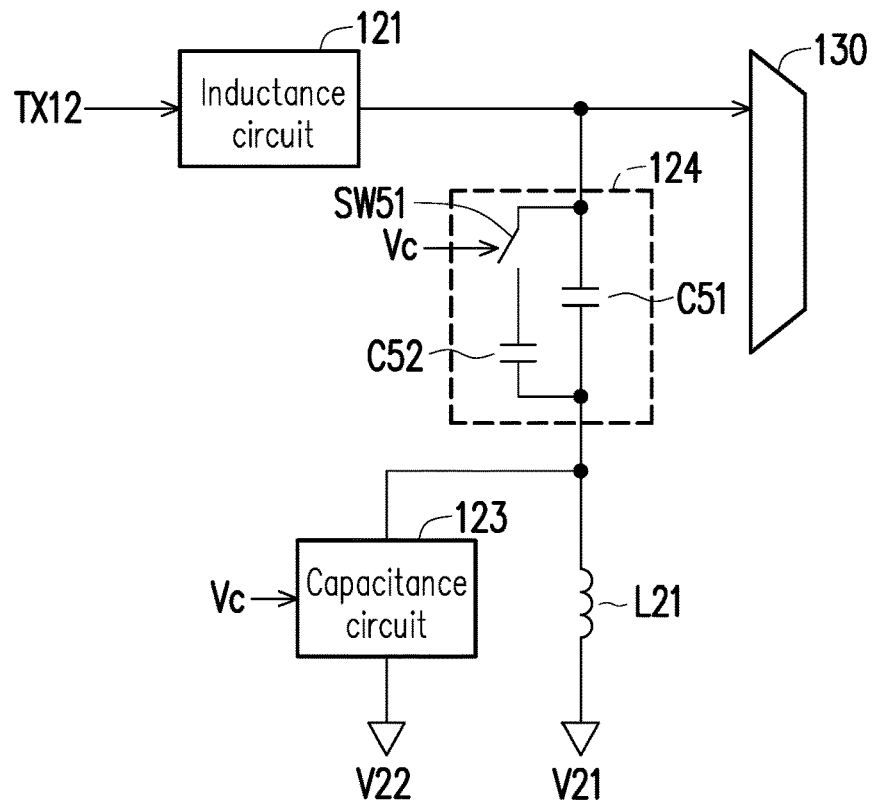
FIG. 5 is a circuit block diagram of a capacitance circuit according to another embodiment of the disclosure.

According to actual design, the capacitance circuit 124 may be any type of variable capacitor. For example, FIG. 5 is a circuit block diagram of a capacitance circuit 124 according to an embodiment of the disclosure. Reference may be made to the related descriptions of FIG. 4 for an inductance circuit 121, the capacitance circuit 124, a capacitance circuit 123, an inductor L21, a single-bit control signal Vc, a reference voltage V21, and a reference voltage V22 shown in FIG. 5. The capacitance circuit 124 shown in FIG. 5 may serve as one of many embodiments of the capacitance circuit 124 shown in FIG. 4.

The capacitance circuit 124 shown in FIG. 5 includes a switch SW51, a capacitor C51, and a capacitor C52. A capacitance value of the capacitor C51 and a capacitance value of the capacitor C52 may be determined according to actual design. A first terminal of the capacitor C51 is coupled to a second terminal of the inductance circuit 121. A second terminal of the capacitor C51 is coupled to a first terminal of the inductor L21 and a first terminal of the capacitance circuit 123. The switch SW51 is controlled by the single-bit control signal Vc. A first terminal of the switch SW51 is coupled to the first terminal of the capacitor C51. A first terminal of the capacitor C52 is coupled to a second terminal of the switch SW51. A second terminal of the capacitor C52 is coupled to the second terminal of the capacitor C51. The single-bit control signal Vc may turn on or turn off the switch SW51, thereby changing a capacitance value of the capacitance circuit 124.

Figure 6:
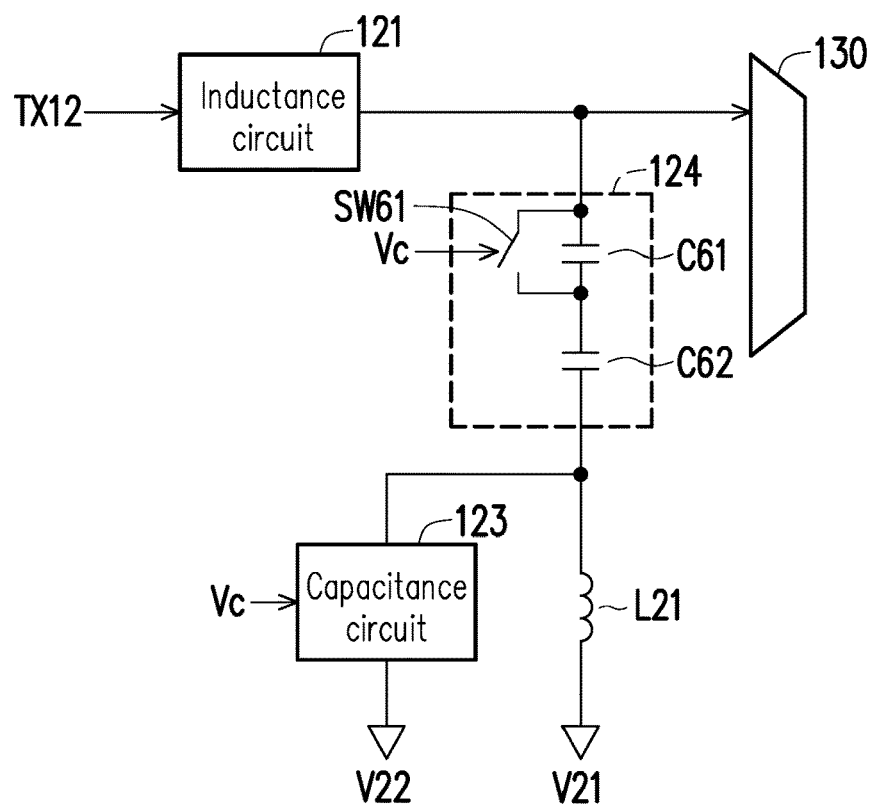
FIG. 6 is a circuit block diagram of a capacitance circuit according to another embodiment of the disclosure.

FIG. 6 is a circuit block diagram of a capacitance circuit 124 according to another embodiment of the disclosure. Reference may be made to the related descriptions of FIG. 4 for an inductance circuit 121, the capacitance circuit 124, a capacitance circuit 123, an inductor L21, a single-bit control signal Vc, a reference voltage V21, and a reference voltage V22 shown in FIG. 6. The capacitance circuit 124 shown in FIG. 6 may serve as one of many embodiments of the capacitance circuit 124 shown in FIG. 4.

The capacitance circuit 124 shown in FIG. 6 includes a switch SW61, a capacitor C61, and a capacitor C62. A capacitance value of the capacitor C61 and a capacitance value of the capacitor C62 may be determined according to actual design. A first terminal of the capacitor C61 is coupled to a second terminal of the inductance circuit 121. The switch SW61 is controlled by the single-bit control signal Vc. A first terminal of the switch SW61 is coupled to the first terminal of the capacitor C61. A second terminal of the switch SW61 is coupled to a second terminal of the capacitor C61. A first terminal of the capacitor C62 is coupled to the second terminal of the capacitor C61. A second terminal of the capacitor C62 is coupled to a first terminal of the inductor L21 and a first terminal of the capacitance circuit 123. The single-bit control signal Vc may turn on or turn off the switch SW61, thereby changing a capacitance value of the capacitance circuit 124.

Figure 7:
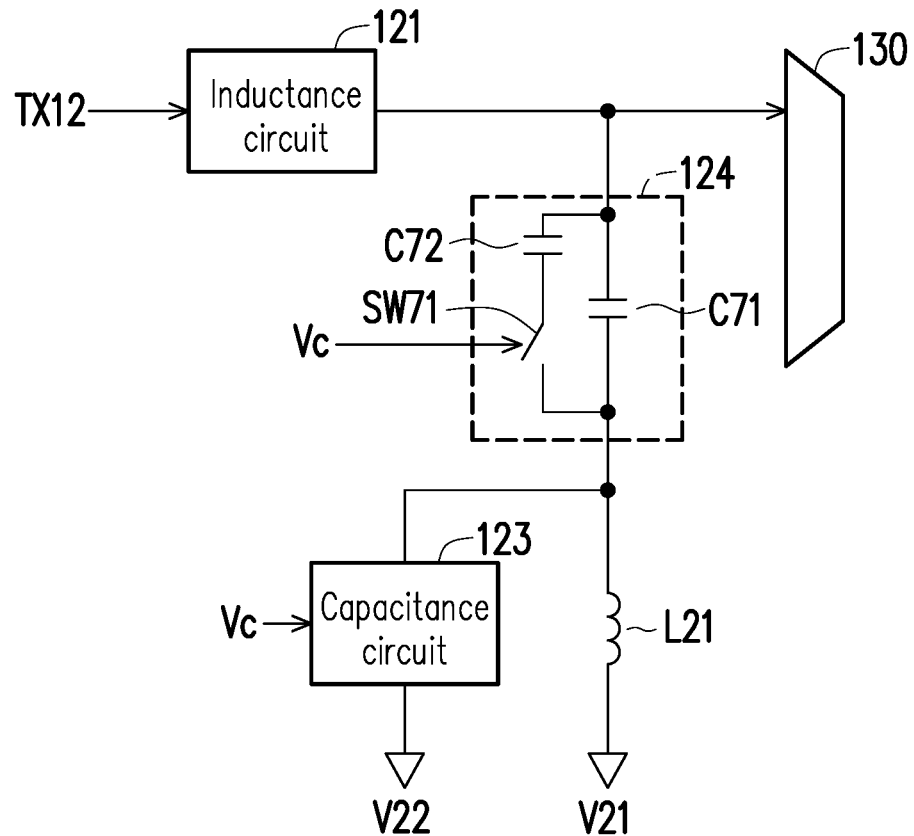
FIG. 7 is a circuit block diagram of a capacitance circuit according to another embodiment of the disclosure.

FIG. 7 is a circuit block diagram of a capacitance circuit 124 according to another embodiment of the disclosure. Reference may be made to the related descriptions of FIG. 4 for an inductance circuit 121, the capacitance circuit 124, a capacitance circuit 123, an inductor L21, a single-bit control signal Vc, a reference voltage V21, and a reference voltage V22 shown in FIG. 7. The capacitance circuit 124 shown in FIG. 7 may serve as one of many embodiments of the capacitance circuit 124 shown in FIG. 4.

The capacitance circuit 124 shown in FIG. 7 includes a switch SW71, a capacitor C71, and a capacitor C72. A capacitance value of the capacitor C71 and a capacitance value of the capacitor C72 may be determined according to actual design. A first terminal of the capacitor C71 is coupled to a second terminal of the inductance circuit 121. A second terminal of the capacitor C71 is coupled to a first terminal of the inductor L21 and a first terminal of the capacitance circuit 123. A first terminal of the capacitor C72 is coupled to the first terminal of the capacitor C71. The switch SW71 is controlled by the single-bit control signal Vc. A first terminal of the switch SW71 is coupled to a second terminal of the capacitor C72. A second terminal of the switch SW71 is coupled to the second terminal of the capacitor C71. The single-bit control signal Vc may turn on or turn off the switch SW71, thereby changing a capacitance value of the capacitance circuit 124.

Figure 8:
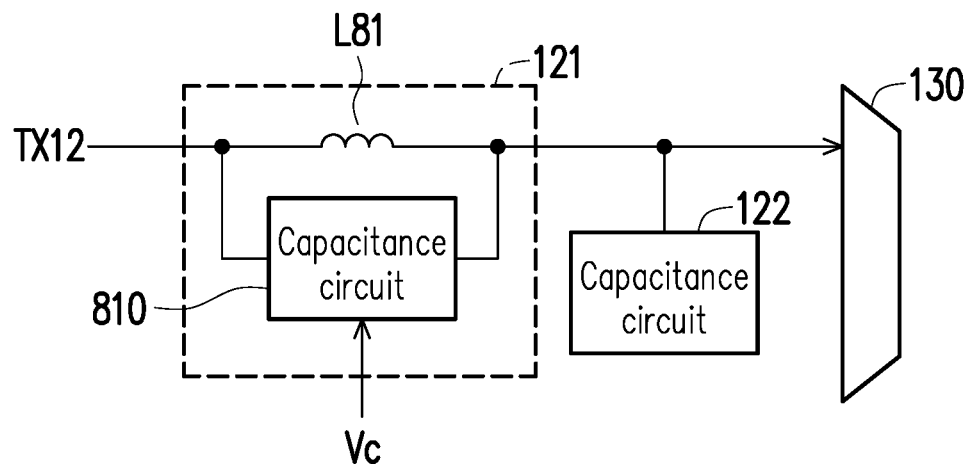
FIG. 8 is a circuit block diagram of an inductance circuit according to an embodiment of the disclosure.

According to actual design, the inductance circuit 121 shown in FIG. 2 may be any type of inductance circuit. For example, FIG. 8 is a circuit block diagram of an inductance circuit 121 according to an embodiment of the disclosure. Reference may be made to the related descriptions of FIG. 2 for a radio frequency signal TX12, an inductance circuit 121, a capacitance circuit 122, and a switch circuit 130 shown in FIG. 8. The inductance circuit 121 shown in FIG. 8 may serve as one of many embodiments of the inductance circuit 121 shown in FIG. 2.

The inductance circuit 121 shown in FIG. 8 includes an inductor L81 and a capacitance circuit 810. An inductance value of the inductor L81 may be determined according to actual design. A first terminal of the inductor L81 is configured to be coupled to a radio frequency signal input terminal of the multi-band matching circuit 120 to receive the radio frequency signal TX12. A second terminal of the inductor L81 is coupled to a first terminal of the capacitance circuit 122 and a second selection terminal of the switch circuit 130. A first terminal of the capacitance circuit 810 is coupled to the first terminal of the inductor L81. A second terminal of the capacitance circuit 810 is coupled to the second terminal of the inductor L81. The capacitance circuit 810 is controlled by a single-bit control signal Vc to change a capacitance value of the capacitance circuit 810. Based on the control of the single-bit control signal Vc, the multi-band matching circuit 120 may adaptively adjust the capacitance value of the capacitance circuit 810, thereby adjusting a fundamental impedance. Therefore, the multi-band matching circuit 120 may be adapted to the multi-band application.

Figure 9:
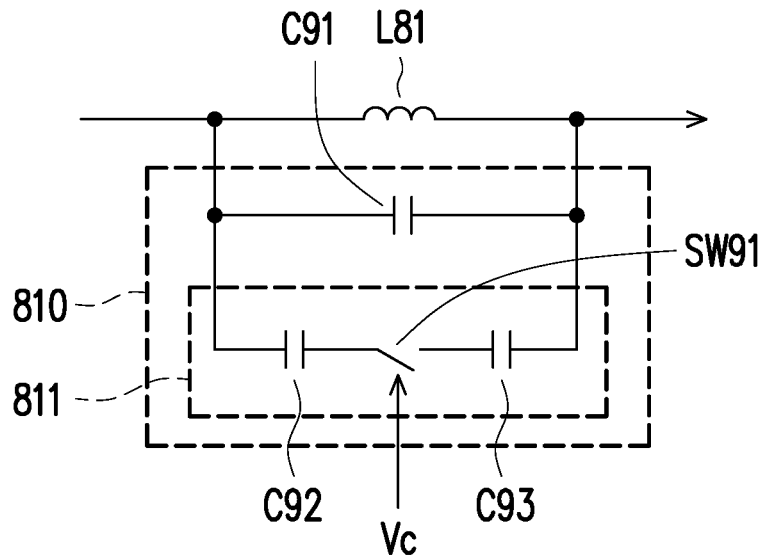
FIG. 9 is a circuit block diagram of a capacitance circuit according to another embodiment of the disclosure.

FIG. 9 is a circuit block diagram of a capacitance circuit 810 according to an embodiment of the disclosure. Reference may be made to the related descriptions of FIG. 8 for an inductor L81 and the capacitance circuit 810 shown in FIG. 9. The capacitance circuit 810 shown in FIG. 9 may serve as one of many embodiments of the capacitance circuit 810 shown in FIG. 8. The capacitance circuit 810 shown in FIG. 9 includes a capacitor C91 and a capacitance circuit 811. A capacitance value of the capacitor C91 may be determined according to actual design. A first terminal of the capacitor C91 and a first terminal of the capacitance circuit 811 are coupled to a first terminal of the inductor L81. A second terminal of the capacitor C91 and a second terminal of the capacitance circuit 811 are coupled to a second terminal of the inductor L81. The capacitance circuit 811 is controlled by a single-bit control signal Vc to change a capacitance value of the capacitance circuit 811.

According to actual design, the capacitance circuit 811 shown in FIG. 9 may be any type of variable capacitor. For example, the capacitance circuit 811 shown in FIG. 9 includes a capacitor C92, a switch SW91, and a capacitor C93. Capacitance values of the capacitor C92 and the capacitor C93 may be determined according to actual design. A first terminal of the capacitor C92 is coupled to the first terminal of the inductor L81. The switch SW91 is controlled by the single-bit control signal Vc. A first terminal of the switch SW91 is coupled to a second terminal of the capacitor C92. A first terminal of the capacitor C93 is coupled to a second terminal of the switch SW91. A second terminal of the capacitor C93 is coupled to the second terminal of the inductor L81. The single-bit control signal Vc may turn on or turn off the switch SW91, thereby changing the capacitance value of the capacitance circuit 811 and a capacitance value of the capacitance circuit 810.

Figure 10:
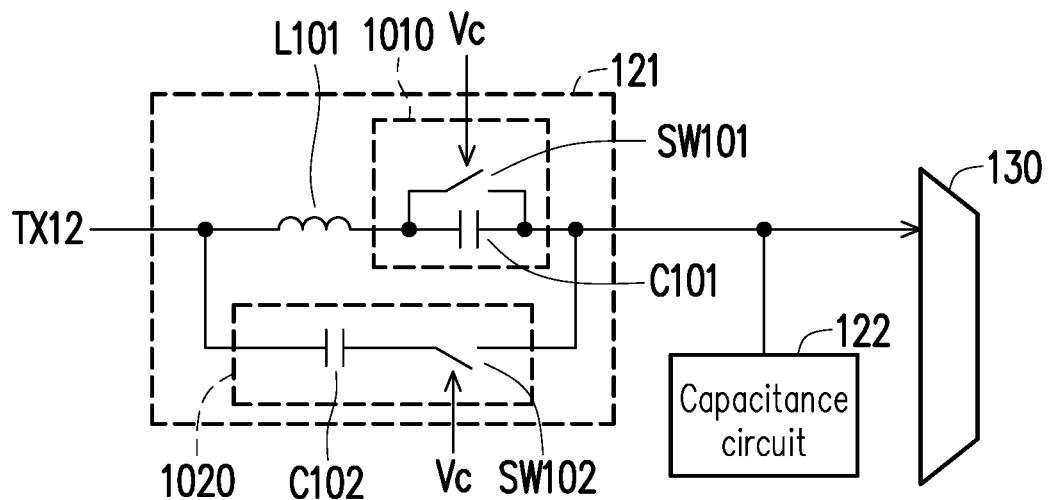
FIG. 10 is a circuit block diagram of an inductance circuit according to another embodiment of the disclosure.

FIG. 10 is a circuit block diagram of an inductance circuit 121 according to another embodiment of the disclosure. Reference may be made to the related descriptions of FIG. 2 for a radio frequency signal TX12, the inductance circuit 121, a capacitance circuit 122, and a switch circuit 130 shown in FIG. 10. The inductance circuit 121 shown in FIG. 10 may serve as one of many embodiments of the inductance circuit 121 shown in FIG. 2. In the embodiment shown in FIG. 10, the inductance circuit 121 includes an inductor L101, a capacitance circuit 1010, and a capacitance circuit 1020. An inductance value of the inductor L101 may be determined according to actual design. A first terminal of the inductor L101 is configured to be coupled to a radio frequency signal input terminal of the multi-band matching circuit 120 to receive the radio frequency signal TX12. A first terminal of the capacitance circuit 1010 is coupled to a second terminal of the inductor L101. A second terminal of the capacitance circuit 1010 is coupled to a first terminal of the capacitance circuit 122 and a second terminal of the switch circuit 130. The capacitance circuit 1010 is controlled by a single-bit control signal Vc to change a capacitance value of the capacitance circuit 1010.

According to actual design, the capacitance circuit 1010 shown in FIG. 10 may be any type of variable capacitor. For example, the capacitance circuit 1010 shown in FIG. 10 includes a capacitor C101 and a switch SW101. A capacitance value of the capacitor C101 may be determined according to actual design. A first terminal of the capacitor C101 is coupled to the second terminal of the inductor L101. A second terminal of the capacitor C101 is coupled to the first terminal of the capacitance circuit 122 and the second terminal of the switch circuit 130. The switch SW101 is controlled by the single-bit control signal Vc. A first terminal of the switch SW101 is coupled to the first terminal of the capacitor C101. A second terminal of the switch SW101 is coupled to the second terminal of the capacitor C101. The single-bit control signal Vc may turn on or turn off the switch SW101, thereby changing the capacitance value of the capacitance circuit 1010.

A first terminal of the capacitance circuit 1020 shown in FIG. 10 is coupled to the first terminal of the inductor L101. A second terminal of the capacitance circuit 1020 is coupled to the second terminal of the capacitance circuit 1010. The capacitance circuit 1020 is controlled by the single-bit control signal Vc to change a capacitance value of the capacitance circuit 1020. According to actual design, the capacitance circuit 1020 shown in FIG. 10 may be any type of variable capacitor. For example, the capacitance circuit 1020 shown in FIG. 10 includes a capacitor C102 and a switch SW102. A capacitance value of the capacitor C102 may be determined according to actual design. A first terminal of the capacitor C102 is coupled to the first terminal of the inductor L101. The switch SW102 is controlled by the single-bit control signal Vc. A first terminal of the switch SW102 is coupled to a second terminal of the capacitor C102. A second terminal of the switch SW102 is coupled to the second terminal of the capacitance circuit 1010. The single-bit control signal Vc may turn on or turn off the switch SW102, thereby changing the capacitance value of the capacitance circuit 1020.

Figure 11:
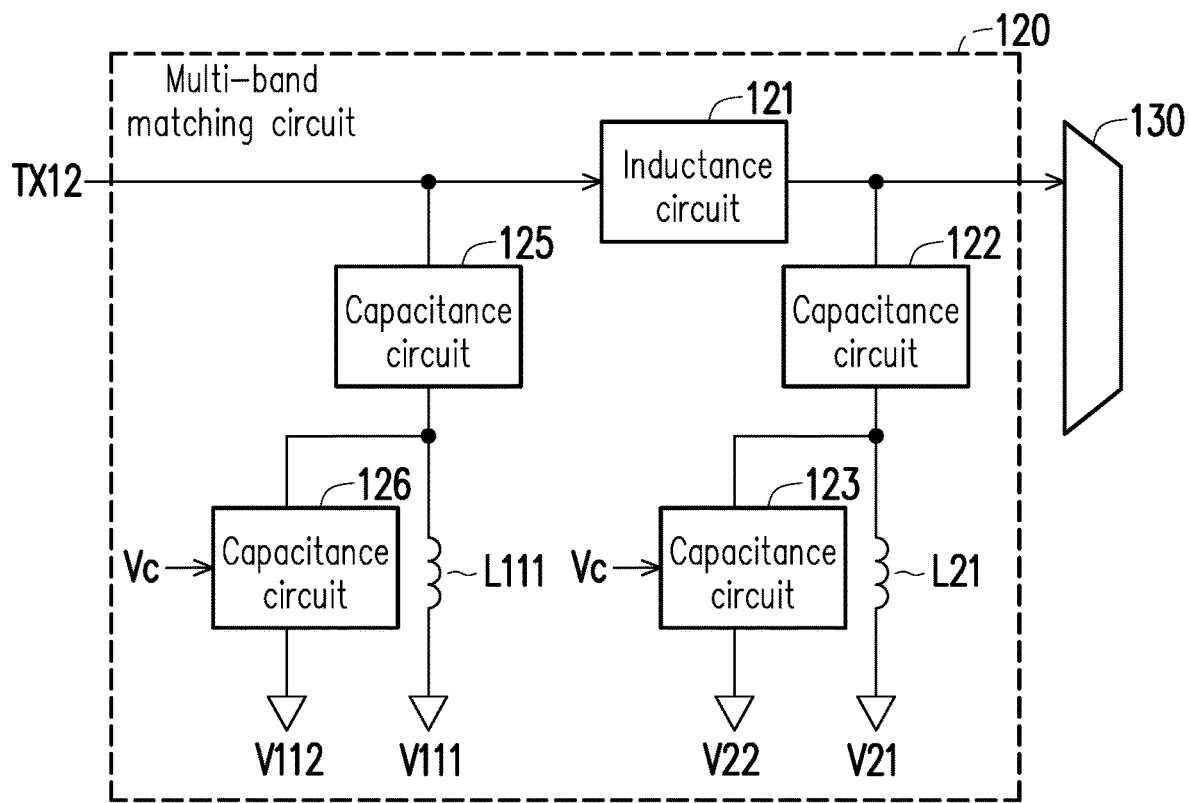
FIG. 11 is a circuit block diagram of a multi-band matching circuit according to another embodiment of the disclosure.

FIG. 11 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 11. The multi-band matching circuit 120 shown in FIG. 11 may serve as one of many embodiments of the multi-band matching circuit 120 shown in FIG. 1. The multi-band matching circuit 120 shown in FIG. 11 includes an inductance circuit 121, a capacitance circuit 122, a capacitance circuit 123, a capacitance circuit 125, a capacitance circuit 126, an inductor L21, and an inductor L111. Inductance values of the inductor L21 and the inductor L111 may be determined according to actual design. Reference may be made to the related descriptions of the inductance circuit 121, the capacitance circuit 122, the capacitance circuit 123, and the inductor L21 shown in FIG. 2 for the inductance circuit 121, the capacitance circuit 122, the capacitance circuit 123, and the inductor L21 shown in FIG. 11.

In the embodiment shown in FIG. 11, a first terminal of the capacitance circuit 125 is coupled to a first terminal of the inductance circuit 121 to receive the radio frequency signal TX12. A first terminal of the inductor L111 is coupled to a second terminal of the capacitance circuit 125. A second terminal of the inductor L111 is coupled to a reference voltage V111. According to actual design, the reference voltage V111 may be a ground voltage or other fixed voltages. A first terminal of the capacitance circuit 126 is coupled to the second terminal of the capacitance circuit 125. A second terminal of the capacitance circuit 126 is coupled to a reference voltage V112. According to actual design, the reference voltage V112 may be a ground voltage or other fixed voltages.

The capacitance circuit 126 is controlled by a single-bit control signal Vc to change a capacitance value of the capacitance circuit 126. When an inductance value of the inductor L21 is equal to an inductance value of the inductor L111, a capacitance value of the capacitance circuit 125 is greater than a capacitance value of the capacitance circuit 122. A first notch frequency formed by the capacitance circuit 122, the capacitance circuit 123, and the inductor L21 is not equal to a second notch frequency formed by the capacitance circuit 125, the capacitance circuit 126, and the inductor L111. For example, the capacitance circuit 122, the capacitance circuit 123, and the inductor L21 form a first frequency band notch, and the capacitance circuit 125, the capacitance circuit 126, and the inductor L111 form a second frequency band notch. The "forming of the frequency band notch" means that a circuit formed by multiple elements may filter out/attenuate signals in a certain frequency range (notch frequency). According to actual design, in some embodiments, the first notch frequency is greater than the second notch frequency. The capacitance circuit 125, the capacitance circuit 126, and the inductor L111 may filter out a $2^{nd}$ harmonic, and the capacitance circuit 122, the capacitance circuit 123, and the inductor L21 may filter out a $3^{rd}$ harmonic. Based on the control of the single-bit control signal Vc, the multi-band matching circuit 120 shown in FIG. 11 may adaptively adjust a capacitance value of the capacitance circuit 123 and the capacitance value of the capacitance circuit 126, thereby adjusting a notch to filter out a harmonic. Therefore, the multi-band matching circuit 120 may be adapted to the multi-band application.

Figure 12:
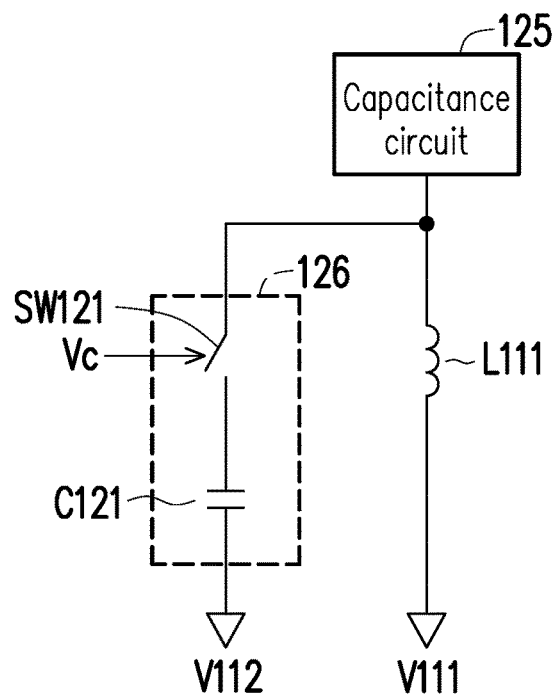
FIG. 12 is a circuit block diagram of a capacitance circuit according to another embodiment of the disclosure.

According to actual design, the capacitance circuit 126 may be any type of variable capacitor. For example, FIG. 12 is a circuit block diagram of a capacitance circuit 126 according to an embodiment of the disclosure. Reference may be made to the related descriptions of FIG. 11 for a capacitance circuit 125, the capacitance circuit 126, an inductor L111, a single-bit control signal Vc, a reference voltage V111, and a reference voltage V112 shown in FIG. 12. The capacitance circuit 126 shown in FIG. 12 may serve as one of many embodiments of the capacitance circuit 126 shown in FIG. 11.

The capacitance circuit 126 shown in FIG. 12 includes a switch SW121 and a capacitor C121. A capacitance value of the capacitor C121 may be determined according to actual design. The switch SW121 is controlled by the single-bit control signal Vc. A first terminal of the switch SW121 is coupled to a second terminal of the capacitance circuit 125. A first terminal of the capacitor C121 is coupled to a second terminal of the switch SW121. A second terminal of the capacitor C121 is coupled to the reference voltage V112. The single-bit control signal Vc may turn on or turn off the switch SW121, thereby changing a capacitance value of the capacitance circuit 126.

In summary, the multi-band matching circuit 120 described in the foregoing embodiments may adaptively adjust capacitance values of the capacitance circuits 123 and 126 based on the control of the single-bit control signal Vc, thereby adjusting a notch frequency to filter out different harmonic components. Therefore, the multi-band matching circuit 120 shown in FIG. 11 may be adapted to the dual-band or multi-band application.

Figure 13:
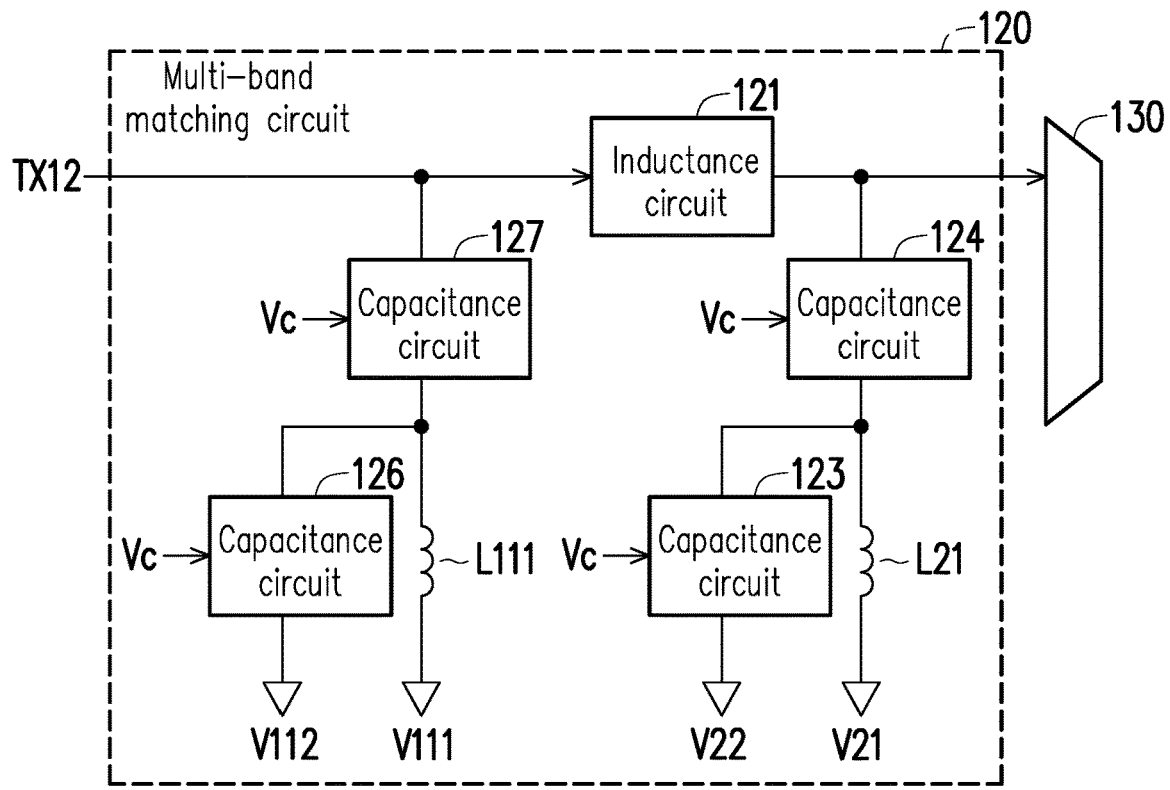
FIG. 13 is a circuit block diagram of a multi-band matching circuit according to another embodiment of the disclosure.

FIG. 13 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 13. The multi-band matching circuit 120 shown in FIG. 13 may serve as one of many embodiments of the multi-band matching circuit 120 shown in FIG. 1. The multi-band matching circuit 120 shown in FIG. 13 includes an inductance circuit 121, a capacitance circuit 124, a capacitance circuit 123, an inductor L21, a capacitance circuit 127, a capacitance circuit 126, and an inductor L111. Reference may be made to the related descriptions of FIG. 4 for the inductance circuit 121, the capacitance circuit 124, the capacitance circuit 123, and the inductor L21 shown in FIG. 13, so there will be no repetition.

Different from the capacitance circuit 125 shown in FIG. 11, the capacitance circuit 127 shown in FIG. 13 may be controlled by a single-bit control signal Vc to change a capacitance value of the capacitance circuit 127. Based on the control of the single-bit control signal Vc, the multi-band matching circuit 120 may adaptively adjust capacitance values of a part of the capacitance circuits 123, 124, 126, and 127. For example, the capacitance values of the capacitance circuit 123 and the capacitance circuit 126 are adjusted to adjust a notch to filter out a harmonic. In addition, by adjusting the capacitance values of the capacitance circuits 124 and 127, the multi-band matching circuit 120 may adaptively adjust a fundamental impedance. Therefore, the multi-band matching circuit 120 shown in FIG. 13 may be adapted to the multi-band application.

Figure 14:
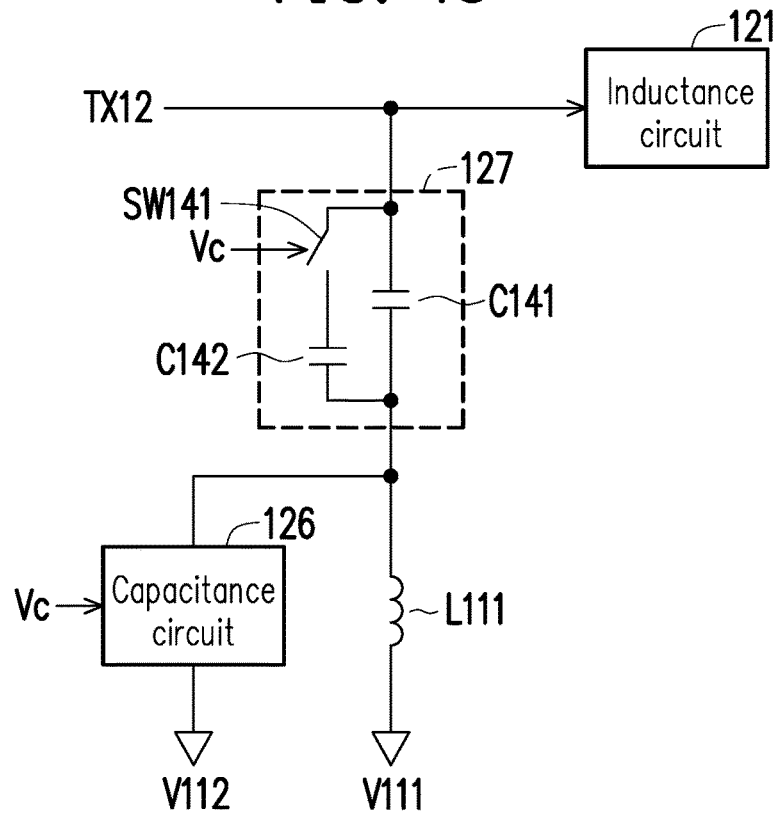
FIG. 14 is a circuit block diagram of a capacitance circuit according to another embodiment of the disclosure.

According to actual design, the capacitance circuit 127 may be any type of variable capacitor. For example, FIG. 14 is a circuit block diagram of a capacitance circuit 127 according to an embodiment of the disclosure. Reference may be made to the related descriptions of FIG. 13 for an inductance circuit 121, the capacitance circuit 127, a capacitance circuit 126, an inductor L111, a single-bit control signal Vc, a reference voltage V111, and a reference voltage V112 shown in FIG. 14. The capacitance circuit 127 shown in FIG. 14 may serve as one of many embodiments of the capacitance circuit 127 shown in FIG. 13.

The capacitance circuit 127 shown in FIG. 14 includes a switch SW141, a capacitor C141, and a capacitor C142. A capacitance value of the capacitor C141 and a capacitance value of the capacitor C142 may be determined according to actual design. A first terminal of the capacitor C141 is coupled to a first terminal of the inductance circuit 121. A second terminal of the capacitor C141 is coupled to a first terminal of the inductor L111 and a first terminal of the capacitance circuit 126. The switch SW141 is controlled by the single-bit control signal Vc. A first terminal of the switch SW141 is coupled to the first terminal of the capacitor C141. A first terminal of the capacitor C142 is coupled to a second terminal of the switch SW141. A second terminal of the capacitor C142 is coupled to the second terminal of the capacitor C141. The single-bit control signal Vc may turn on or turn off the switch SW141, thereby changing a capacitance value of the capacitance circuit 127.

Figure 15:
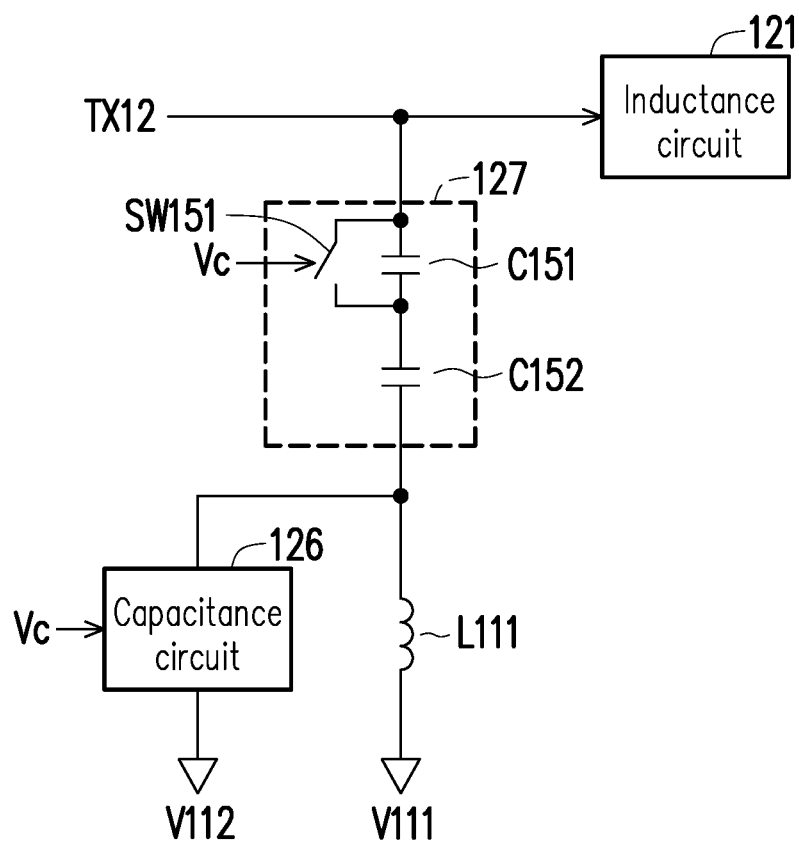
FIG. 15 is a circuit block diagram of a capacitance circuit according to another embodiment of the disclosure.

FIG. 15 is a circuit block diagram of a capacitance circuit 127 according to another embodiment of the disclosure. Reference may be made to the related descriptions of FIG. 13 for an inductance circuit 121, the capacitance circuit 127, a capacitance circuit 126, an inductor L111, a single-bit control signal Vc, a reference voltage V111, and a reference voltage V112 shown in FIG. 15. The capacitance circuit 127 shown in FIG. 15 may serve as one of many embodiments of the capacitance circuit 127 shown in FIG. 13.

The capacitance circuit 127 shown in FIG. 15 includes a switch SW151, a capacitor C151, and a capacitor C152. A capacitance value of the capacitor C151 and a capacitance value of the capacitor C152 may be determined according to actual design. A first terminal of the capacitor C151 is coupled to a first terminal of the inductance circuit 121. The switch SW151 is controlled by the single-bit control signal Vc. A first terminal of the switch SW151 is coupled to a first terminal of the capacitor C151. A second terminal of the switch SW151 is coupled to a second terminal of the capacitor C151. A first terminal of the capacitor C152 is coupled to the second terminal of the capacitor C151. A second terminal of the capacitor C152 is coupled to a first terminal of the inductor L111 and a first terminal of the capacitance circuit 126. The single-bit control signal Vc may turn on or turn off the switch SW151, thereby changing a capacitance value of the capacitance circuit 127.

In summary, the multi-band matching circuit 120 described in the foregoing embodiments may adaptively adjust capacitance values of a part of the capacitance circuits 123, 124, 126, and 127 based on the control of the single-bit control signal Vc. For example, the capacitance values of the capacitance circuit 123 and the capacitance circuit 126 are adjusted, thereby adjusting a notch frequency to filter out different harmonic components. In addition, by adjusting the capacitance values of the capacitance circuit 124 and the capacitance circuit 127 of the inductance circuit 121, the multi-band matching circuit 120 may adaptively adjust different fundamental impedances. Therefore, the multi-band matching circuit 120 shown in FIG. 13 may be adapted to the dual-band or multi-band application.

Figure 16:
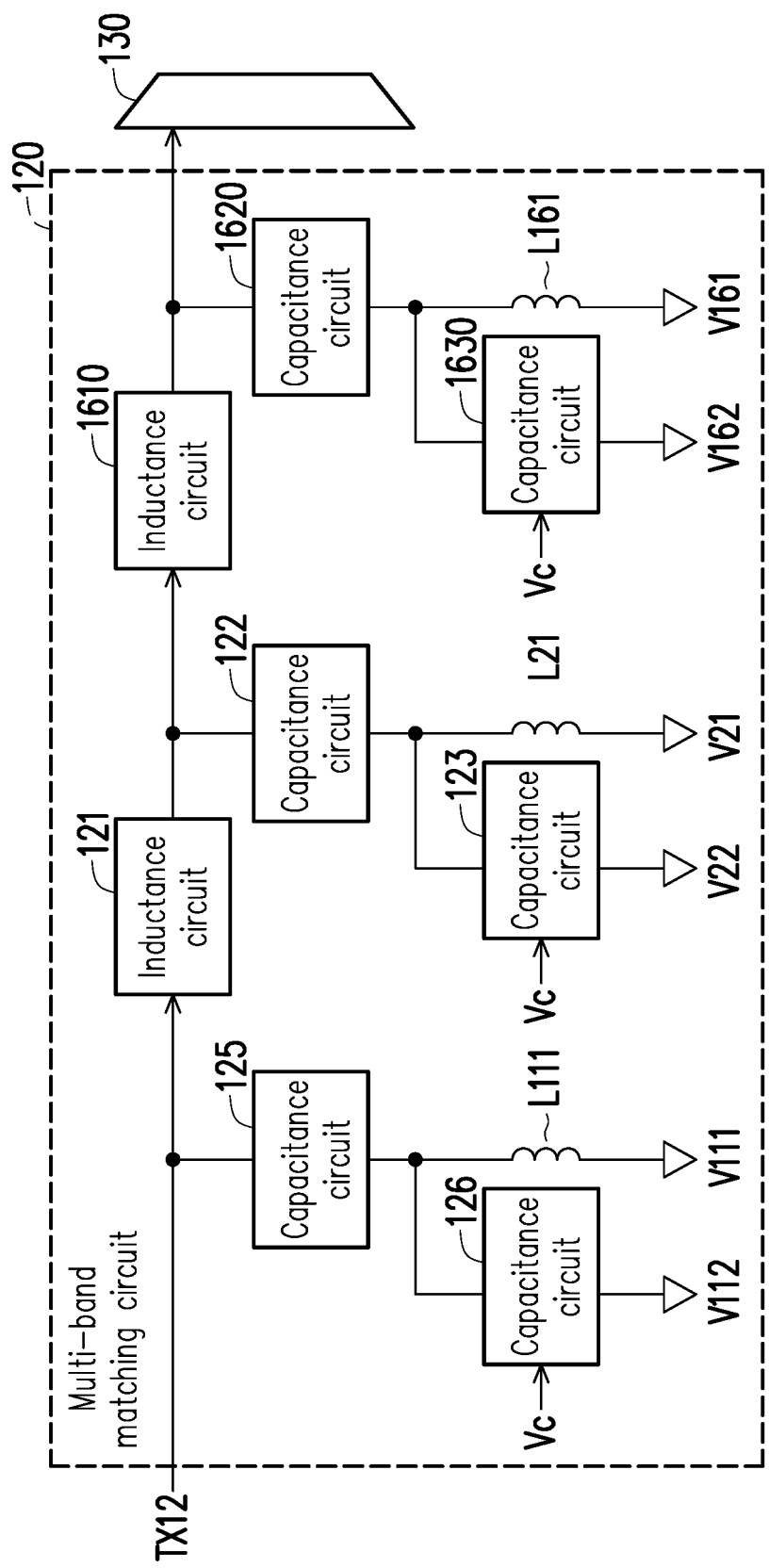
FIG. 16 is a circuit block diagram of a multi-band matching circuit according to another embodiment of the disclosure.

FIG. 16 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 16, so there will be no repetition. The multi-band matching circuit 120 shown in FIG. 16 may serve as one of many embodiments of the multi-band matching circuit 120 shown in FIG. 1. The multi-band matching circuit 120 shown in FIG. 16 includes an inductance circuit 121, an inductance circuit 1610, a capacitance circuit 122, a capacitance circuit 123, an inductor L21, a capacitance circuit 125, a capacitance circuit 126, an inductor L111, a capacitance circuit 1620, a capacitance circuit 1630, and an inductor L161. An inductance value of the inductor L161 may be determined according to actual design. Reference may be made to the related descriptions of FIG. 11 for the inductance circuit 121, the capacitance circuit 122, the capacitance circuit 123, the inductor L21, the capacitance circuit 125, the capacitance circuit 126, and the inductor L111 shown in FIG. 16.

In the embodiment shown in FIG. 16, a first terminal of the inductance circuit 1610 is coupled to a second terminal of the inductance circuit 121. A second terminal of the inductance circuit 1610 is coupled to a radio frequency signal output terminal of the multi-band matching circuit 120, that is, coupled to a second selection terminal of the switch circuit 130. A first terminal of the capacitance circuit 1620 is coupled to the second terminal of the inductance circuit 1610. A first terminal of the inductor L161 is coupled to a second terminal of the capacitance circuit 1620. A second terminal of the inductor L161 is coupled to a reference voltage V161. According to actual design, the reference voltage V161 may be a ground voltage or other fixed voltages. A first terminal of the capacitance circuit 1630 is coupled to the second terminal of the capacitance circuit 1620. A second terminal of the capacitance circuit 1630 is coupled to a reference voltage V163. According to actual design, the reference voltage V163 may be a ground voltage or other fixed voltages.

The capacitance circuit 1630 is controlled by a single-bit control signal Vc to change a capacitance value of the capacitance circuit 1630. Reference may be made to the related descriptions of the capacitance circuit 123 shown in FIG. 2 or FIG. 3 or reference may be made to the related descriptions of the capacitance circuit 126 shown in FIG. 11 or FIG. 12 for the implementation details of the capacitance circuit 1630 shown in FIG. 16, so there will be no repetition. In the embodiment shown in FIG. 16, based on the control of the single-bit control signal Vc, the multi-band matching circuit 120 may adaptively adjust capacitance values of the capacitance circuits 123, 126, and 1630, thereby adjusting a notch to filter out a harmonic. Therefore, the multi-band matching circuit 120 shown in FIG. 16 may be adapted to the multi-band application.

In some actual designs, the capacitance circuits 125, 122, and 1620 shown in FIG. 16 may be controlled by the single-bit control signal Vc to change capacitance values. In such a design, reference may be made to the related descriptions of the capacitance circuit 127 shown in FIG. 13, FIG. 14, or FIG. 15 for the implementation details of the capacitance circuit 125 shown in FIG. 16, and reference may be made to the related descriptions of the capacitance circuit 124 shown in FIG. 4, FIG. 5, FIG. 6, or FIG. 7 for the implementation details of the capacitance circuit 122 shown in FIG. 16. Reference may be made to the related descriptions of the capacitance circuit 122 or the capacitance circuit 125 for the implementation details of the capacitance circuit 1620 shown in FIG. 16, so there will be no repetition.

In the embodiment shown in FIG. 16, a capacitance value of the capacitance circuit 810 (referring to the related descriptions of FIG. 8) of the inductance circuit 121 is less than a capacitance value of the capacitance circuit 122 (or 124), and the capacitance value of the capacitance circuit 122 (or 124) is less than a capacitance value of capacitance circuit 125 (or 127). The capacitance circuit 122 (or 124), the capacitance circuit 123, and the inductor L21 form a first notch frequency, the inductance circuit 121 forms a second notch frequency, and the capacitance circuit 125 (or 127), the capacitance circuit 126, and the inductor L111 form a third notch frequency. The first notch frequency, the second notch frequency, and the third notch frequency are not equal to one another. For example, the first notch frequency is less than the second notch frequency, and the third notch frequency is less than the first notch frequency. The capacitance circuit 125 (or 127), the capacitance circuit 126, and the inductor L111 are configured to filter out a $2^{nd}$ harmonic, the capacitance circuit 810 of the inductance circuit 121 and the inductor L81 (referring to the related descriptions of FIG. 8) are configured to filter out a $4^{th}$ harmonic, and the capacitance circuit 122 (or 124), the capacitance circuit 123, and the inductor L21 are configured to filter out a frequency component between the $2^{nd}$ harmonic and a $3^{rd}$ harmonic.

Figure 17:
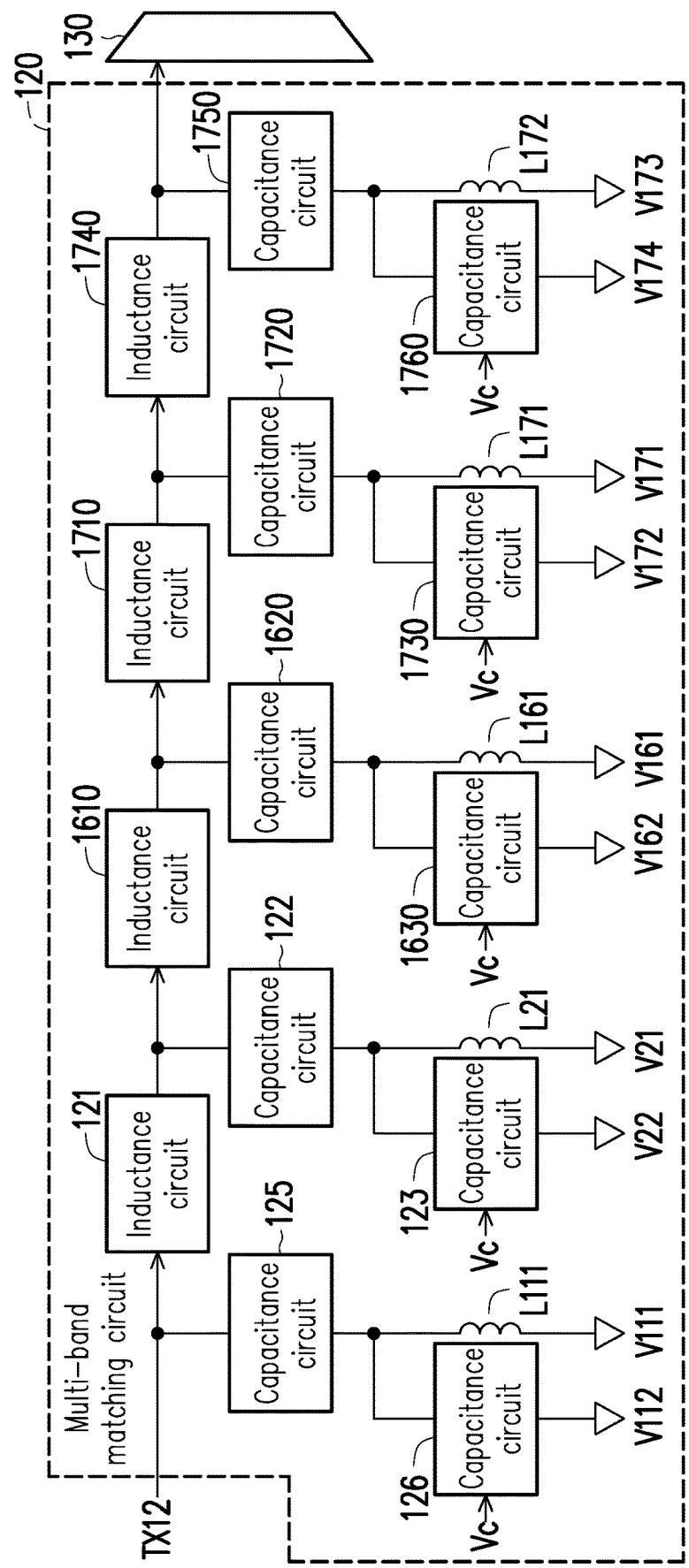
FIG. 17 is a circuit block diagram of a multi-band matching circuit according to another embodiment of the disclosure.

FIG. 17 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 17, so there will be no repetition. The multi-band matching circuit 120 shown in FIG. 17 may serve as one of many embodiments of the multi-band matching circuit 120 shown in FIG. 1. The multi-band matching circuit 120 shown in FIG. 17 includes an inductance circuit 121, an inductance circuit 1610, an inductance circuit 1710, an inductance circuit 1740, a capacitance circuit 122, a capacitance circuit 123, an inductor L21, a capacitance circuit 125, a capacitance circuit 126, an inductor L111, a capacitance circuit 1620, a capacitance circuit 1630, an inductor L161, a capacitance circuit 1720, a capacitance circuit 1730, an inductor L171, a capacitance circuit 1750, a capacitance circuit 11760, and an inductor L172. Reference may be made to the related descriptions of FIG. 16. for the inductance circuit 121, the inductance circuit 1610, the capacitance circuit 122, the capacitance circuit 123, the inductor L21, the capacitance circuit 125, the capacitance circuit 126, the inductor L111, the capacitance circuit 1620, the capacitance circuit 1630, and the inductor L161 shown in FIG. 17 may, so there will be no repetition.

In the embodiment shown in FIG. 17, a first terminal of the inductance circuit 1710 is coupled to a second terminal of the inductance circuit 1610. A first terminal of the inductance circuit 1740 and a first terminal of the capacitance circuit 1720 are coupled to a second terminal of the inductance circuit 1710. A second terminal of the inductance circuit 1740 is coupled to a radio frequency signal output terminal of the multi-band matching circuit 120, that is, coupled to a second selection terminal of the switch circuit 130. An inductance value of the inductor L171 may be determined according to actual design. A first terminal of the inductor L171 is coupled to a second terminal of the capacitance circuit 1720. A second terminal of the inductor L171 is coupled to a reference voltage V171. According to actual design, the reference voltage V171 may be a ground voltage or other fixed voltages. A first terminal of the capacitance circuit 1730 is coupled to the second terminal of the capacitance circuit 1720. A second terminal of the capacitance circuit 1730 is coupled to a reference voltage V172. According to actual design, the reference voltage V172 may be a ground voltage or other fixed voltages. The capacitance circuit 1730 is controlled by a single-bit control signal Vc to change a capacitance value of the capacitance circuit 1730.

A first terminal of the capacitance circuit 1750 is coupled to the second terminal of the inductance circuit 1740. A first terminal of the inductor L172 is coupled to a second terminal of the capacitance circuit 1750. A second terminal of the inductor L172 is coupled to a reference voltage V173. According to actual design, the reference voltage V173 may be a ground voltage or other fixed voltages. A first terminal of the capacitance circuit 1760 is coupled to the second terminal of the capacitance circuit 1750. A second terminal of the capacitance circuit 1760 is coupled to a reference voltage V174. According to actual design, the reference voltage V174 may be a ground voltage or other fixed voltages. The capacitance circuit 1760 is controlled by the single-bit control signal Vc to change a capacitance value of the capacitance circuit 1760.

Figure 18:
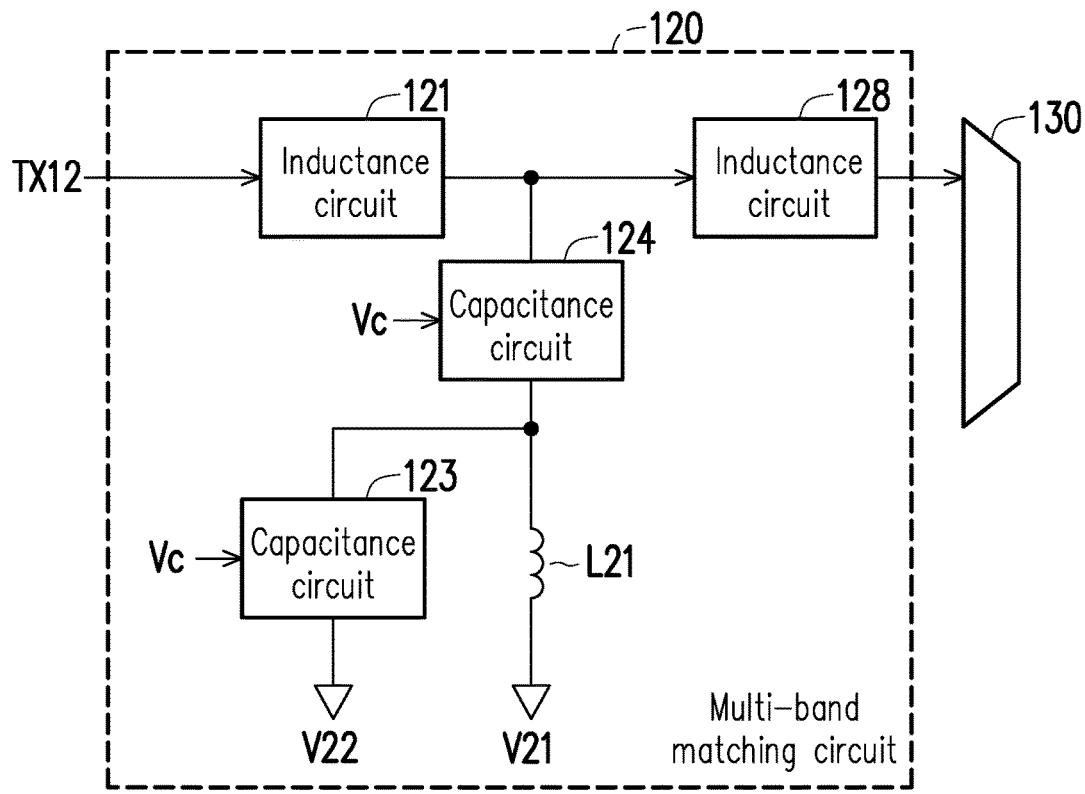
FIG. 18 is a circuit block diagram of a multi-band matching circuit according to another embodiment of the disclosure.

FIG. 18 is a circuit block diagram of a multi-band matching circuit 120 according to another embodiment of the disclosure. Reference may be made to the related descriptions of FIG. 1 for a radio frequency signal TX12, the multi-band matching circuit 120, and a switch circuit 130 shown in FIG. 18, so there will be no repetition. The multi-band matching circuit 120 shown in FIG. 18 may serve as one of many embodiments of the multi-band matching circuit 120 shown in FIG. 1. The multi-band matching circuit 120 shown in FIG. 18 includes an inductance circuit 121, an inductance circuit 128, a capacitance circuit 124, a capacitance circuit 123, and an inductor L21. Reference may be made to the related descriptions of FIG. 4 for the inductance circuit 121, the capacitance circuit 124, the capacitance circuit 123, and the inductor L21 shown in FIG. 18, so there will be no repetition. In the embodiment shown in FIG. 18, a first terminal of the inductance circuit 128 is coupled to a second terminal of the inductance circuit 121. A second terminal of the inductance circuit 128 is configured to be coupled to a radio frequency signal output terminal of the multi-band matching circuit 120, that is, couple to a second selection terminal of the switch circuit 130.

Figure 19:
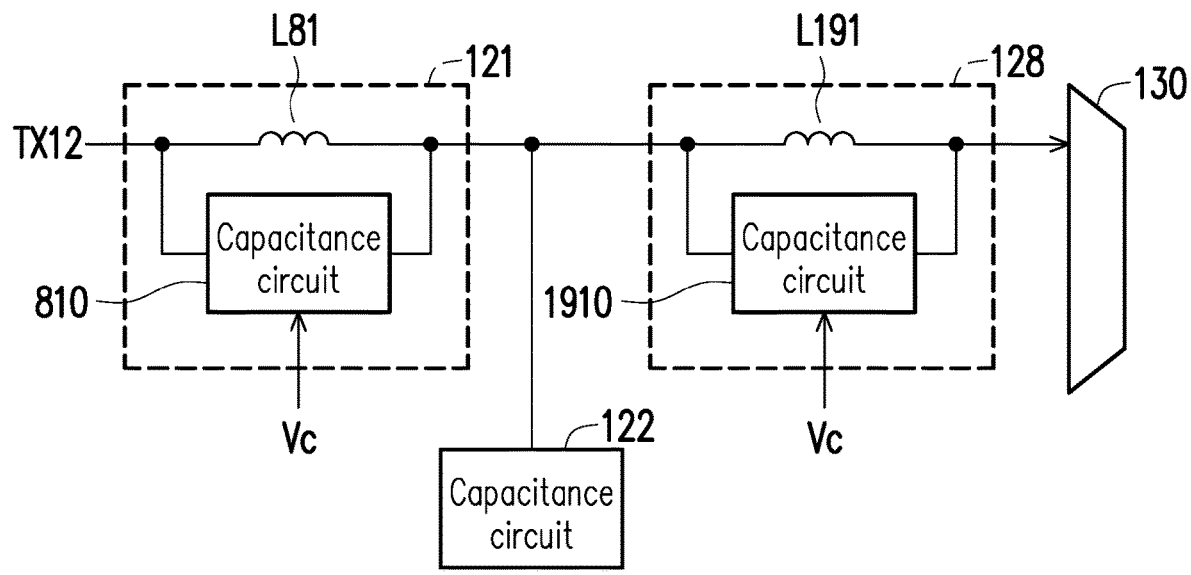
FIG. 19 is a circuit block diagram of an inductance circuit according to another embodiment of the disclosure.

According to actual design, the inductance circuit 121 and the inductance circuit 128 shown in FIG. 18 may be any type of inductance circuits. For example, FIG. 19 is a circuit block diagram of an inductance circuit 128 according to an embodiment of the disclosure. Reference may be made to the related descriptions of the radio frequency signal TX12, the inductance circuit 121, the capacitance circuit 124, the inductance circuit 128, and the switch circuit 130 shown in FIG. 18 for the radio frequency signal TX12, the inductance circuit 121, the capacitance circuit 122, the inductance circuit 128, and the switch circuit 130 shown in FIG. 19. The inductance circuit 121 and the inductance circuit 128 shown in FIG. 19 may serve as one of many embodiments of the inductance circuit 121 and the inductance circuit 128 shown in FIG. 18. The inductance circuit 121 shown in FIG. 19 includes an inductor L81 and a capacitance circuit 810. Reference may be made to the related descriptions of the inductor L81 and the capacitance circuit 810 shown in FIG. 8 for the inductor L81 and the capacitance circuit 810 shown in FIG. 19, so there will be no repetition.

The inductance circuit 128 shown in FIG. 19 includes an inductor L191 and a capacitance circuit 1910. An inductance value of the inductor L191 may be determined according to actual design. A first terminal of the inductor L191 is coupled to a second terminal of the inductance circuit 121. A second terminal of the inductor L191 is configured to be coupled to a radio frequency signal output terminal of the multi-band matching circuit 120, that is, coupled to a second selection terminal of the switch circuit 130. A first terminal of the capacitance circuit 1910 is coupled to the first terminal of the inductor L191. A second terminal of the capacitance circuit 1910 is coupled to the second terminal of the inductor L191. The capacitance circuit 1910 is controlled by a single-bit control signal Vc to change a capacitance value of the capacitance circuit 1910. Based on the control of the single-bit control signal Vc, the multi-band matching circuit 120 may adaptively adjust capacitance values of the capacitance circuits 810 and 1910, thereby adjusting a fundamental impedance and a harmonic. Therefore, the multi-band matching circuit 120 may be adapted to the multi-band application.

Figure 20:
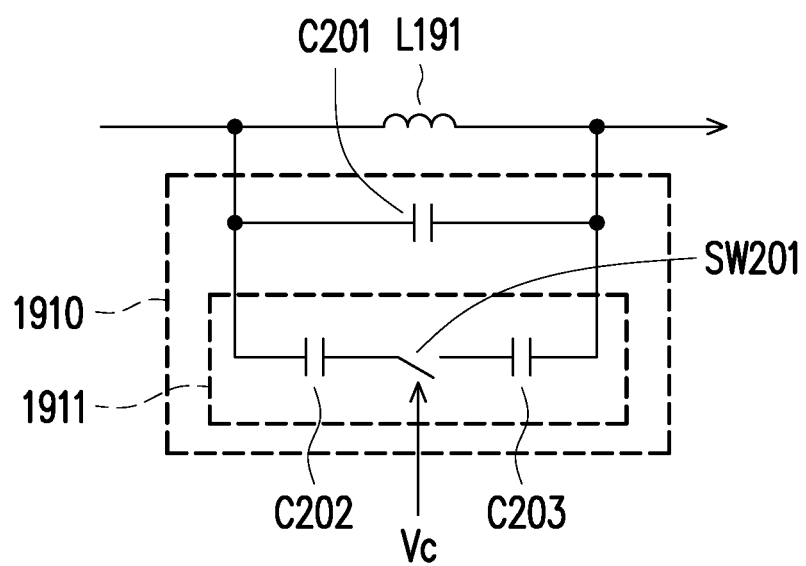
FIG. 20 is a circuit block diagram of a capacitance circuit according to another embodiment of the disclosure.

FIG. 20 is a circuit block diagram of a capacitance circuit 1910 according to an embodiment of the disclosure. Reference may be made to the related descriptions of FIG. 19 for an inductor L191 and the capacitance circuit 1910 shown in FIG. 20. The capacitance circuit 1910 shown in FIG. 20 may serve as one of many embodiments of the capacitance circuit 1910 shown in FIG. 19. The capacitance circuit 1910 shown in FIG. 20 includes a capacitor C201 and a capacitance circuit 1911. A capacitance value of the capacitor C201 may be determined according to actual design. A first terminal of the capacitor C201 and a first terminal of capacitance circuit 1911 are coupled to a first terminal of the inductor L191. A second terminal of the capacitor C201 and a second terminal of the capacitance circuit 1911 are coupled to a second terminal of the inductor L191. The capacitance circuit 1911 is controlled by a single-bit control signal Vc to change a capacitance value of the capacitance circuit 1911.

According to actual design, the capacitance circuit 1911 shown in FIG. 20 may be any type of variable capacitor. For example, the capacitance circuit 1911 shown in FIG. 20 includes a capacitor C202, a switch SW201, and a capacitor C203. Capacitance values of the capacitor C202 and the capacitor C203 may be determined according to actual design. A first terminal of the capacitor C202 is coupled to a first terminal of the inductor L191. The switch SW201 is controlled by a single-bit control signal Vc. A first terminal of the switch SW201 is coupled to a second terminal of the capacitor C202. A first terminal of the capacitor C203 is coupled to a second terminal of the switch SW201. A second terminal of the capacitor C203 is coupled to the second terminal of the inductor L191. The single-bit control signal Vc may turn on or turn off the switch SW201, thereby changing the capacitance value of the capacitance circuit 1911 and a capacitance value of the capacitance circuit 1910.

In summary, the multi-band matching circuit 120 described in the foregoing embodiments may adaptively adjust a capacitance value of the capacitance circuit 123 based on the control of the single-bit control signal Vc, thereby adjusting a notch frequency to filter out different harmonic components. In addition, by adjusting the capacitance values of the capacitance circuits 810 and 1910, the multi-band matching circuit 120 may adaptively adjust different fundamental impedances and notch frequencies. Therefore, the multi-band matching circuit 120 shown in FIG. 18 may be adapted to the dual-band or multi-band application.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A multi-band matching circuit, comprising:
a first inductance circuit, having a first terminal for coupling to a radio frequency signal input terminal of the multi-band matching circuit;
a first capacitance circuit, having a first terminal coupled to a second terminal of the first inductance circuit;
a first inductor, having a first terminal coupled to a second terminal of the first capacitance circuit, wherein a second terminal of the first inductor is coupled to a first reference voltage, and the first terminal of the first inductor is not directly coupled to any one of the first terminal and the second terminal of the first inductance circuit; and
a second capacitance circuit, having a first terminal coupled to the second terminal of the first capacitance circuit, wherein a second terminal of the second capacitance circuit is coupled to a second reference voltage, and the second capacitance circuit is controlled by a single-bit control signal to change a capacitance value of the second capacitance circuit.

2. The multi-band matching circuit according to claim 1, wherein the second capacitance circuit comprises:
a switch, controlled by the single-bit control signal, wherein a first terminal of the switch is coupled to the second terminal of the first capacitance circuit; and
a capacitor, having a first terminal coupled to a second terminal of the switch, wherein a second terminal of the capacitor is coupled to the second reference voltage.

3. The multi-band matching circuit according to claim 1, wherein the first capacitance circuit is controlled by the single-bit control signal to change a capacitance value of the first capacitance circuit.

4. The multi-band matching circuit according to claim 3, wherein the first capacitance circuit comprises:
a first capacitor, having a first terminal coupled to the second terminal of the first inductance circuit, wherein a second terminal of the first capacitor is coupled to the first terminal of the first inductor and the first terminal of the second capacitance circuit;
a switch, controlled by the single-bit control signal, wherein a first terminal of the switch is coupled to the first terminal of the first capacitor; and
a second capacitor, having a first terminal coupled to a second terminal of the switch, wherein a second terminal of the second capacitor is coupled to the second terminal of the first capacitor.

5. The multi-band matching circuit according to claim 3, wherein the first capacitance circuit comprises:
a first capacitor, having a first terminal coupled to the second terminal of the first inductance circuit;
a switch, controlled by the single-bit control signal, wherein a first terminal of the switch is coupled to the first terminal of the first capacitor, and a second terminal of the switch is coupled to a second terminal of the first capacitor; and
a second capacitor, having a first terminal coupled to the second terminal of the first capacitor, wherein a second terminal of the second capacitor is coupled to the first terminal of the first inductor and the first terminal of the second capacitance circuit.

6. The multi-band matching circuit according to claim 3, wherein the first capacitance circuit comprises:
a first capacitor, having a first terminal coupled to the second terminal of the first inductance circuit, wherein a second terminal of the first capacitor is coupled to the first terminal of the first inductor and the first terminal of the second capacitance circuit;
a second capacitor, having a first terminal coupled to the first terminal of the first capacitor; and
a switch, controlled by the single-bit control signal, wherein a first terminal of the switch is coupled to a second terminal of the second capacitor, and a second terminal of the switch is coupled to the second terminal of the first capacitor.

7. The multi-band matching circuit according to claim 1, further comprising:
a third capacitance circuit, having a first terminal coupled to the first terminal of the first inductance circuit;
a second inductor, having a first terminal coupled to a second terminal of the third capacitance circuit, wherein a second terminal of the second inductor is coupled to a third reference voltage; and
a fourth capacitance circuit, having a first terminal coupled to the second terminal of the third capacitance circuit, wherein a second terminal of the fourth capacitance circuit is coupled to a fourth reference voltage, and the fourth capacitance circuit is controlled by the single-bit control signal to change a capacitance value of the fourth capacitance circuit.

8. The multi-band matching circuit according to claim 7, wherein when an inductance value of the first inductor is equal to an inductance value of the second inductor, a capacitance value of the third capacitance circuit is greater than a capacitance value of the first capacitance circuit.

9. The multi-band matching circuit according to claim 7, wherein a first notch frequency formed by the first capacitance circuit, the second capacitance circuit, and the first inductor is not equal to a second notch frequency formed by the third capacitance circuit, the fourth capacitance circuit, and the second inductor.

10. The multi-band matching circuit according to claim 9, wherein the first notch frequency is greater than the second notch frequency.

11. The multi-band matching circuit according to claim 7, wherein the third capacitance circuit, the fourth capacitance circuit, and the second inductor are configured to filter out a 2nd harmonic, and the first capacitance circuit, the second capacitance circuit, and the first inductor are configured to filter out a 3rd harmonic.

12. The multi-band matching circuit according to claim 7, wherein the fourth capacitance circuit comprises:
- a switch, controlled by the single-bit control signal, wherein a first terminal of the switch is coupled to the second terminal of the third capacitance circuit; and
- a capacitor, having a first terminal coupled to a second terminal of the switch, wherein a second terminal of the capacitor is coupled to the fourth reference voltage.

13. The multi-band matching circuit according to claim 7, wherein the third capacitance circuit is controlled by the single-bit control signal to change a capacitance value of the third capacitance circuit.

14. The multi-band matching circuit according to claim 13, wherein the third capacitance circuit comprises:
- a first capacitor, having a first terminal coupled to the first terminal of the first inductance circuit, wherein a second terminal of the first capacitor is coupled to the first terminal of the second inductor and the first terminal of the fourth capacitance circuit;
- a switch, controlled by the single-bit control signal, wherein a first terminal of the switch is coupled to the first terminal of the first capacitor; and
- a second capacitor, having a first terminal coupled to a second terminal of the switch, wherein a second terminal of the second capacitor is coupled to the second terminal of the first capacitor.

15. The multi-band matching circuit according to claim 7, further comprising:
- a second inductance circuit, having a first terminal coupled to the second terminal of the first inductance circuit;
- a fifth capacitance circuit, having a first terminal coupled to a second terminal of the second inductance circuit;
- a third inductor, having a first terminal coupled to a second terminal of the fifth capacitance circuit, wherein a second terminal of the third inductor is coupled to a fifth reference voltage; and
- a sixth capacitance circuit, having a first terminal coupled to the second terminal of the fifth capacitance circuit, wherein a second terminal of the sixth capacitance circuit is coupled to a sixth reference voltage, and the sixth capacitance circuit is controlled by the single-bit control signal to change a capacitance value of the sixth capacitance circuit.

16. The multi-band matching circuit according to claim 1, wherein the first inductance circuit comprises:
- a second inductor, having a first terminal for coupling to the radio frequency signal input terminal of the multi-band matching circuit, wherein a second terminal of the second inductor is coupled to the first terminal of the first capacitance circuit; and
- a third capacitance circuit, having a first terminal coupled to the first terminal of the second inductor, wherein a second terminal of the third capacitance circuit is coupled to the second terminal of the second inductor, and the third capacitance circuit is controlled by the single-bit control signal to change a capacitance value of the third capacitance circuit.

17. A radio frequency device, comprising:
- an antenna;
- a switch circuit, having a common terminal coupled to the antenna;
- a receiver amplifier, having an input terminal coupled to a first selection terminal of the switch circuit;
- a transmitter amplifier; and
- a multi-band matching circuit, having a first terminal and a second terminal respectively coupled to an output terminal of the transmitter amplifier and a second selection terminal of the switch circuit, wherein the multi-band matching circuit comprises:
  - a first inductance circuit, having a first terminal for coupling to the output terminal of the transmitter amplifier;
  - a first capacitance circuit, having a first terminal coupled to a second terminal of the first inductance circuit;
  - a first inductor, having a first terminal coupled to a second terminal of the first capacitance circuit, wherein a second terminal of the first inductor is coupled to a first reference voltage, and the first terminal of the first inductor is not directly coupled to any one of the first terminal and the second terminal of the first inductance circuit; and
  - a second capacitance circuit, having a first terminal coupled to the second terminal of the first capacitance circuit, wherein a second terminal of the second capacitance circuit is coupled to a second reference voltage, and the second capacitance circuit is controlled by a single-bit control signal to change a capacitance value of the second capacitance circuit.

18. The radio frequency device according to claim 17, wherein the second capacitance circuit comprises:
- a switch, controlled by the single-bit control signal, wherein a first terminal of the switch is coupled to the second terminal of the first capacitance circuit; and
- a capacitor, having a first terminal coupled to a second terminal of the switch, wherein a second terminal of the capacitor is coupled to the second reference voltage.

19. The radio frequency device according to claim 17, wherein the first capacitance circuit is controlled by the single-bit control signal to change a capacitance value of the first capacitance circuit.

20. The radio frequency device according to claim 19, wherein the first capacitance circuit comprises:
- a first capacitor, having a first terminal coupled to the second terminal of the first inductance circuit, wherein a second terminal of the first capacitor is coupled to the first terminal of the first inductor and the first terminal of the second capacitance circuit;
- a switch, controlled by the single-bit control signal, wherein a first terminal of the switch is coupled to the first terminal of the first capacitor; and
- a second capacitor, having a first terminal coupled to a second terminal of the switch, wherein a second terminal of the second capacitor is coupled to the second terminal of the first capacitor.

* * * * *